(12) United States Patent
Skull et al.

(10) Patent No.: US 11,614,718 B2
(45) Date of Patent: Mar. 28, 2023

(54) SYSTEM AND METHOD FOR THE AUTONOMOUS CONSTRUCTION AND/OR DESIGN OF AT LEAST ONE COMPONENT PART FOR A COMPONENT

(71) Applicant: Dr. Ing. h.c. F. Porsche Aktiengesellschaft, Stuttgart (DE)

(72) Inventors: Matteo Skull, Stuttgart (DE); Selven Ayasamy, Meyzieu (FR)

(73) Assignee: Dr. Ing. h.c. F. Porsche Aktiengesellschaft

( * ) Notice: Subject to any disclaimer, the term of this patent is extended or adjusted under 35 U.S.C. 154(b) by 132 days.

(21) Appl. No.: 17/376,271

(22) Filed: Jul. 15, 2021

(65) Prior Publication Data

US 2022/0019179 A1    Jan. 20, 2022

(30) Foreign Application Priority Data

Jul. 16, 2020   (DE) .................. 10 2020 118 805.6

(51) Int. Cl.
  *G05B 13/00*   (2006.01)
  *G05B 13/02*   (2006.01)
  *G06F 18/21*   (2023.01)

(52) U.S. Cl.
  CPC ......... *G05B 13/028* (2013.01); *G05B 13/021* (2013.01); *G05B 13/024* (2013.01); *G06F 18/2178* (2023.01)

(58) Field of Classification Search
  CPC .. G05B 13/028; G05B 13/021; G05B 13/024; G06F 18/2178
  See application file for complete search history.

(56) References Cited

U.S. PATENT DOCUMENTS 5,579,442 A  *  11/1996  Kimoto ................. B25J 9/161
                                                              700/251
5,999,908 A  *  12/1999  Abelow ............. G06Q 30/0203
                                                              434/118

(Continued)

FOREIGN PATENT DOCUMENTS

DE    102016011525 A1    3/2017
DE    102017006054 A1    1/2018

(Continued)

OTHER PUBLICATIONS

Ertel, Wolfgang: Grundkurs Kunstliche Intelligenz; Eine praxisorientierte Einfuhrung. 4. Auflage. Wiesbaden: Springer Fachmedien, 2016. Kapitel 10.—ISBN 978-3-658-13549-2. DOI https://doi.org/10.1007/978-3-658-13549-2. [e-Book], with partial English translation, 25 pages.

(Continued)

*Primary Examiner* — Michael D Masinick
(74) *Attorney, Agent, or Firm* — RatnerPrestia

(57) ABSTRACT

A method for the autonomous construction and/or design of at least one component part of a component includes the step of determining a state ($s_i$) of the component part by a state module, wherein a state ($s_i$) is defined by parameters ($p_i$) such as data and/or measured values of at least one property ($e_i$) of the component part. The state ($s_i$) is transmitted to a reinforcement learning agent, which uses a reinforcement learning algorithm. A calculation function ($f_i$) and/or an action ($a_i$) is selected on the basis of a policy for a state ($s_i$) for the modification of at least one parameter ($p_i$) by the reinforcement learning agent. A modeled value for the property ($e_i$) is calculated using the modified parameter ($p_i$). A new state ($s_{i+1}$) is calculated by an environment module on the basis of the modeled value for the property ($e_i$).

15 Claims, 3 Drawing Sheets

(56) References Cited

U.S. PATENT DOCUMENTS

| | | | |
|---|---|---|---|
| 9,792,397 B1* | 10/2017 | Nagaraja | G06F 30/32 |
| 10,019,674 B2 | 7/2018 | Sugimoto | |
| 10,146,225 B2 | 12/2018 | Ryan | |
| 10,502,253 B2 | 12/2019 | Watanabe et al. | |
| 2007/0143039 A1 | 6/2007 | Mol | |
| 2008/0091628 A1* | 4/2008 | Srinivasa | G06N 3/08 |
| | | | 706/12 |
| 2018/0003588 A1 | 1/2018 | Iwanami | |
| 2018/0260498 A1* | 9/2018 | Nagaraja | G06F 30/327 |
| 2019/0197198 A1 | 6/2019 | Cheong et al. | |
| 2020/0257933 A1* | 8/2020 | Steingrimsson | C22C 30/00 |
| 2022/0019179 A1* | 1/2022 | Skull | G05B 13/024 |

FOREIGN PATENT DOCUMENTS

| | | |
|---|---|---|
| DE | 102017011754 A1 | 6/2018 |
| DE | 102018104717 A1 | 9/2018 |

OTHER PUBLICATIONS

Kreutz, Clemens: Steuerung stochastischer Systeme; Ein Vergleich von Strategien; Diplomarbeit. Freiburg: Albert-Ludwigs-Universitat, 2003. https://freidok.uni-freiburg.de/fedora/objects/freidok: 155315/datastreams/FILE1/content [Feb. 2, 2021], with partial English translation, 67 pages.

* cited by examiner

SYSTEM AND METHOD FOR THE AUTONOMOUS CONSTRUCTION AND/OR DESIGN OF AT LEAST ONE COMPONENT PART FOR A COMPONENT

CROSS-REFERENCE TO RELATED APPLICATION

This application claims priority to German Patent Application No. 10 2020 118 805.6, filed Jul. 16, 2020, the content of such application being incorporated by reference herein in its entirety.

FIELD OF THE INVENTION

The invention concerns a system and a method for the autonomous construction and design of at least one component part for a component.

BACKGROUND OF THE INVENTION

In mechanical and automotive engineering, many components with mechanical, electrical, electronic, hydraulic, chemical, etc. component parts are required and, because of new series of models, environmental regulations, etc. undergo continual further development, which is time-consuming and cost-intensive. In the following text a bearing is considered as an example of a component.

Bearings are used in mechanical engineering and equipment construction in order to allow a restricted relative movement between two movable components. They allow movements in desired degrees of freedom and prevent movements in the undesired degrees of freedom. At the same time, they reduce the friction in the desired movement, while they suppress undesired movements. The most commonly used bearings are simple rotary bearings (radial bearings) and linear bearings. In both cases, there is just one desired degree of freedom, to be specific the rotation in the case of the radial bearing and the translation in the case of the linear bearing. In addition, there are radial sliding bearings, with two degrees of freedom, and for example the ball joint bearing, which allows three rotations. Depending on the operating principle applied, a distinction is made between sliding bearings and rolling bearings. In the case of the sliding bearing, the parts that are movable with respect to one another touch or are separated from one another by a sliding film. In the case of the rolling bearing, rolling bodies such as balls or rollers, which perform a rolling movement, are located between an inner ring and an outer ring.

The choice or the design of a bearing for a construction project depends on selected constraints such as the relative speed of the two movable components, the loads, the operating temperature, the service life, the material of the components, etc. The elements of a bearing are constructed or designed in such a way that various parameters such as the dimension, shape and materials of the bearing are altered while retaining the chosen constraints. Optimization algorithms may be used for this. Generally, however, the design of a bearing is based on the know-how and experience of experts such as engineers. This however does involve a considerable expenditure of time and therefore cost.

US 2007/143039 A1, which is incorporated by reference herein, describes a method and a sensor arrangement for determining a load vector which acts on a rolling bearing during operation. A number of sensors are provided, measuring the displacement and/or strain in one of the elements of a rolling bearing. Also provided is a mode shape coefficients calculator, which is connected to the multitude of sensors in order to present a deformation of the element by calculating the amplitude and phase of Fourier terms representing at least one radial mode shape of the ring shape element. A neural network is provided, connected to the mode shape coefficients calculator, the neural network being trained to present the load vector on the rolling bearing by the Fourier terms.

DE 10 2018 104 717 A1, which is incorporated by reference herein, describes a method for predicting vehicle dimensions. A machine learning module is trained on the basis of the set of simulated observed dimensions and the set of known vehicle dimensions.

US 2019197198 B1, which is incorporated by reference herein, describes a structural design machine in which part of the process for the structural design of mechanical assemblies is performed in an automated manner. A user interface is provided, offering tools for recording input data for a specific structural design task. The input data are processed by means of a targeted optimization algorithm, which provides a range of possible structural design options. Each structural design option describes a mechanical assembly that represents a possible solution for the structural design task.

SUMMARY OF THE INVENTION

Described herein is a method and a system for the autonomous construction and/or design of at least one component part for a component that is distinguished by great reliability and accuracy and can be easily implemented.

The present invention proposes a method and a system by which it is possible to construct and/or design at least one component part for a component autonomously, whereby the structural design process for the component part can be carried out more efficiently and more specifically with respect to a target.

According to a first aspect, the invention provides a method for the autonomous construction and/or design of at least one component part of a component. The method comprises the following method steps:

determining a state $s_i$ of the component part by a state module, wherein a states $s_i$ is defined by parameters $p_i$ such as data and/or measured values of at least one property $e_i$ of the component part, and transmitting the state $s_i$ to a reinforcement learning agent, which uses a reinforcement learning algorithm; selecting a calculation function $f_i$ and/or an action $a_i$ on the basis of a policy for a state s for the modification of at least one parameter $p_i$ of the at least one property $e_i$ by the reinforcement learning agent;

calculating a modeled value for the property $e_i$ by means of the modified parameter $p_i$;

calculating a new state $s_{i+1}$ by an environment module on the basis of the modeled value for the property $e_i$;

comparing the new state $s_{i+1}$ with a target state $s_t$ and assigning a deviation $\Delta$ for the result of the comparison in the state module;

ascertaining a reward $r_i$ by a reward module for the result of the comparison;

adapting the policy of the reinforcement learning agent on the basis of the reward $r_i$, wherein, when there is a convergence of the policy, the optimal action for the calculated state $s_j$ is returned and, when there is a non-convergence of the policy, a further calculation function $f_j$ and/or a further action $a_{j+1}$ for a state $s_{j+1}$ with a modification of at least one parameter $p_i$ of the at least one property $e_i$ is selected by the reinforcement learning agent for as long as it takes until the target state $s_t$ is achieved.

In a further development, a positive action A(+), which increases the value for a parameter $p_i$, a neutral action A(0), in the case of which the value of the parameter $p_i$ stays the same, and a negative action A(−), in the case of which the value of the parameter $p_i$ is reduced, are provided.

In particular, the reinforcement learning algorithm is designed as a Markov decision process or as Temporal Difference Learning (TD-learning) or as Q-learning or as SARSA or as Monte-Carlo simulation or as an Actor-Critic method.

In one embodiment, at least one parameter $p_i$ represents a dimension or a material or a shaping or a measured value.

In a further embodiment, at least one property $e_i$ represents a safety factor or a thermal resistance or an electrical resistance or a conductivity or a strength or a rupture behavior or a color or a density or a plastic deformation or a stress resistance, a compressive resistance or a flexural resistance or material properties or surface properties or a heat treatment.

In one embodiment, at least one policy represents an assignment of states $s_i$ to actions $a_i$.

In one embodiment, it is provided that the policy comprises that, when there is a positive reward for the calculated state, a selection probability of the previous action for this state is increased, when there is a negative reward for the calculated state, the selection probability of the previous action for this state is reduced, and, when there is a convergence of the policy, the optimal action for the calculated state is returned.

Advantageously, the results of the calculation are stored in the form of states $s_i$, actions $a_i$, rewards $r_i$ and strategies in a cloud-computing environment and are available via the Internet.

In a further embodiment, the RL agent, the action module, the environment module, the state module and the reward module have one or more technical interfaces and protocols for access to the cloud-computing environment.

In a development, it is provided that a number of RL agents are coupled and interact with one another via the cloud-computing environment.

According to a second aspect, the invention provides a system for the autonomous construction and/or design of at least one component part of a component. The system comprises a reinforcement learning agent with a reinforcement learning algorithm, an action module, an environment module, a state module and a reward module. The state module is designed to determine a state $s_i$ of the component part, wherein a state $s_i$ is defined by data and/or measured values of at least one property $e_i$ of the component part, and to transmit the state $s_i$ to a reinforcement learning agent. The reinforcement learning agent is designed to select a calculation function $f_j$ and/or an action $a_j$ on the basis of a policy for a state $s_j$ for the modification of at least one parameter $p_i$ of the at least one property $e_i$. The action module is designed to calculate a modeled value for the property $e_i$ by means of the modified parameter $p_i$. The environment module is designed to calculate a new state $s_{j+1}$ on the basis of the modeled value for the property $e_i$. The state module is designed to compare the new state $s_{j+1}$ with a target state $s_t$ and to assign a deviation Δ to the result of the comparison. The reward module is designed to ascertain a reward $r_i$ for the result of the comparison and to pass on the reward $r_i$ for the result of the comparison to the reinforcement learning agent, which is designed to adapt the policy on the basis of this reward $r_i$, wherein, when there is a convergence of the policy, the optimal action for the calculated state $s_j$ is returned and, when there is a nonconvergence of the policy, a further calculation function $f_j$ and/or a further action $a_{j+1}$ for a state $s_{j+1}$ with a modification of at least one parameter $p_i$ of the at least one property $e_i$ is selected by the RL agent 200 for as long as it takes until the target state $s_t$ is achieved.

Advantageously, a positive action A(+), which increases the value for a parameter $p_i$ a neutral action A(0), in the case of which the value of the parameter $p_i$ stays the same, and a negative action A(−), in the case of which the value of the parameter $p_i$ is reduced, are provided.

In particular, the reinforcement learning algorithm is designed as a Markov decision process or as Temporal Difference Learning (TD-Learning) or as Q-Learning or as SARSA or as Monte-Carlo simulation or as an Actor-Critic method.

In one embodiment, at least one parameter $p_i$ represents a dimension or a material or a shaping or a measured value.

In one embodiment, at least one property $e_i$ represents a safety factor or a thermal resistance or an electrical resistance or a conductivity or a strength or a rupture behavior or a color or a density or a plastic deformation or a stress resistance, a compressive resistance or a flexural resistance or material properties or surface properties or a heat treatment.

According to a third aspect, the invention provides a computer program product, which comprises an executable program code which is configured in such a way that, when executed, it carries out the method according to the first aspect.

BRIEF DESCRIPTION OF THE DRAWING FIGURES

The invention is explained in detail below with reference to exemplary embodiments shown in the drawing.

Figure 5:
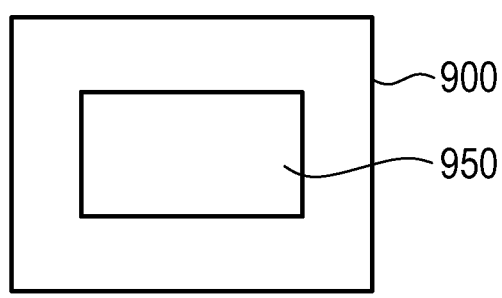

FIG. 5 schematically shows a computer program product according to an embodiment of the third aspect of the invention.

DETAILED DESCRIPTION OF THE INVENTION

Additional characteristics, aspects and advantages of the invention or its exemplary embodiments will become evident from the detailed description in conjunction with the claims.

Figure 1:
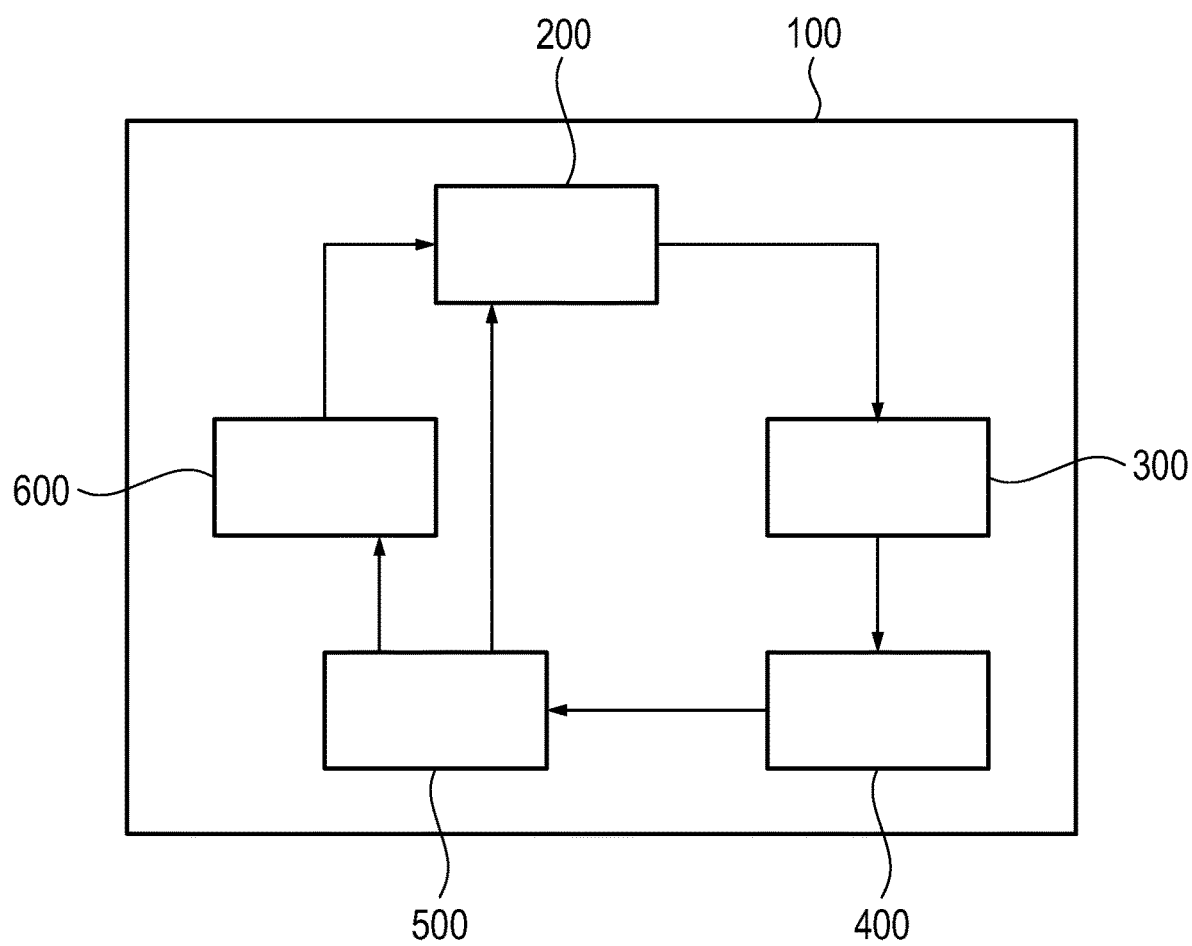
FIG. 1 shows a block diagram for explaining an exemplary embodiment of a system according to aspects of the invention.

FIG. 1 shows a system 100 according to aspects of the invention for the autonomous construction and design of component parts for a component, such as for example mechanical bearing component parts for a bearing. The bearing may be for example a sliding bearing or rolling bearing. In the case of a sliding bearing, the parts that are movable with respect to one another touch or are separated from one another by a sliding film. In the case of the rolling bearing, rolling bodies such as balls or rollers, which perform a rolling movement, are located between an inner ring and an outer ring. The component parts of a bearing can be described by parameters $p_i$ such as the dimension, the shaping, the selected material, etc. However, other mechanical component parts may also be concerned, such as for example component parts of a spring, which are characterized by parameters $p_i$ such as a spring constant, number of turns, etc. Generally, the mechanical component parts of a component can therefore be described by parameters $p_i$.

For the purposes of the invention, a component part may however also be an electrical and/or electronic and/or mechatronic and/or hydraulic and/or chemical and/or biological components.

The system 100 according to aspects of the invention is based on methods of reinforcement learning and comprises a reinforcement learning agent (RL) 200, an action module 300, an environment module 400, a state module 500 and a reward module 600.

The RL agent 200 and the action module 300, the environment module 400, the state module 500 and a reward module 600 may be respectively provided with a processor and/or a storage unit.

A "processor" may be understood in connection with the invention as meaning for example a machine or an electronic circuit. A processor may be in particular a central processing unit (CPU), a microprocessor or a microcontroller, for example an application-specific integrated circuit or a digital signal processor, possibly in combination with a storage unit to store program commands, etc. A processor may also be understood as meaning a virtualized processor, a virtual machine or a soft CPU. It may also be for example a programmable processor which is equipped with configuration steps for carrying out the specified method according to aspects of the invention or is configured with configuration steps in such a way that the programmable processor implements the features according to aspects of the invention of the method, the component part, the modules or other aspects and/or partial aspects of the invention.

A "storage unit" or "storage module" and the like may be understood in connection with the invention as meaning for example a volatile storage device in the form of a Random-Access Memory (RAM) or a permanent storage device such as a hard disk or a data medium or e.g. a replaceable storage module. However, the storage module can also be a cloud-based storage solution.

A "module" may be understood in connection with the invention as meaning for example a processor and/or a storage unit for storing program commands. For example, the processor is specifically configured to execute the program commands in such a way that the processor and/or the storage unit perform(s) functions in order to implement or carry out the method according to aspects of the invention or a step of the method according to aspects of the invention.

"Measured values" should be understood in connection with the invention as meaning both raw data and already prepared data, for example from measurement results of sensors.

The RL agent 200 selects at least one action $a_i \in A$ from a set of available actions for a determined state $s_i \in S$ from a set of available states. The choice of the selected action a, is based on a strategy or policy. For the selected action $a_i$, the agent 200 receives a reward $r_i \in \mathbb{R}$ from the reward module 600. The agent 200 receives the states $s_i \in S$ from the state module 500, to which the RL agent 200 can access. The strategy is adapted on the basis of the rewards $r_i$ received. In the strategy it is specified which action $a_i \in A$ from the set of available actions is to be selected for a determined state $s_i \in S$ from the set of available states. This has the effect of generating a new state $s_{i+1}$, for which the RL agent 200 receives a reward $r_i$. A strategy consequently specifies the assignment between a state $s_i$ and an action $a_i$, so that the strategy indicates the choice of the action $a_i$ to be carried out for a states $s_i$ The aim of the RL agent 200 is in this case to maximize the rewards $r_i, r_{i+1}, \ldots, r_{i+n}$ achieved.

In the action module 300, the actions $a_i$ selected by the RL agent 200 are carried out. An action $a_i$ performs an adaptation of a parameter $p_i \in P$ from the set of parameters for at least one property $e_i$ of the component part that is to be constructed or designed. The measured parameter values $pi_j$ of a property $e_i$ may have been ascertained by sensors that are not described any more specifically here. Preferably, the parameter values are stored in a table of values and the like. The parameters $p_i \in P$ are for example the dimension of a ball and the material from which it is to be produced. The action $a_i$ is preferably one of the actions A(+), A(0) and A(−). A positive action A(+) is an action which increases the value for a parameter $p_i$, a neutral action A(0) is an action in the case of which the value of the parameter $p_i$ remains the same, whereas in the case of a negative action A(−) the value of the parameter $p_i$ is reduced.

The environment module 400 calculates the states $s_i \in s$ on the basis of the chosen action $a_i$ and taking into account previously specified constraints. The constraints may also be economic aspects such as the cost structure, the energy costs, the environmental balance, the availability or the delivery situation.

A state $s_i \in S$ is consequently defined by the selection of determined parameter values $p_i$ for properties $e_i$, and is consequently characterized by measured and/or calculated values of selected properties $e_i$. The properties $e_i$ may be for example safety coefficients $k_i$ for the respective mechanical component part, but other coefficients such as the energy expenditure during production are also conceivable. Furthermore, possible properties are a thermal resistance or an electrical resistance or a conductivity or a strength or a rupture behavior or a color or a density or a plastic deformation or a stress resistance, a compressive resistance or a flexural resistance or material properties or surface properties or a heat treatment. In the case of the selection of a color, the color itself is the property and the specific color, for example a determined Pantone shade, is the parameter.

In the state module 500, a deviation Δ between a target state $s_t$, such as a target safety coefficient $C_t$, and the calculated state $s_i$, such as a safety coefficient $C_i$, is calculated. The end state is achieved when the calculated states $s_i$ are equal to or greater than the target states $s_t$.

In the reward module 600, a reward $r_i$ is assigned to the degree of the deviation Δ between the calculated value for the state $s_i$ and the target value of the state $s_t$. Since the degree of the deviation Δ is dependent on the selection of the respective action A(+), A(0), A(−), the reward $r_i$ is preferably assigned to the respective selected action A(+), A(0), A(−) in a matrix or a database. A reward $r_i$ preferably has the values +1 and −1, wherein a small or positive deviation Δ between the calculated state $s_i$ and the target state $s_t$ is rewarded with +1, and is consequently enhanced, whereas a considerable negative deviation Δ is rewarded with −1, and is consequently negatively assessed. It is however also conceivable that values >1 and values <1 are used.

Preferably, a Markov decision process is used as the algorithm for the RL agent 200. It may however also be envisaged to use a Temporal Difference Learning (TD-learning) algorithm. An RL agent 200 with a TD-learning algorithm does not only undertake the adaptation of the actions A(+), A(0), A(−) when it receives the reward but after each action $a_i$ on the basis of an estimated expected reward. Furthermore, algorithms such as Q-learning and SARSA are also conceivable as well as Actor-Critic or else Monte-Carlo simulations. With the algorithm, dynamic programming and an adaptation of the strategy are possible by iteration methods.

In addition, the RL agent 200 and/or the action module 300 and/or the environment module 400 and/or the state module 500 and/or the reward module 600 include calculation methods and algorithms $f_i$ for mathematical regression methods or physical model calculations that describe a correlation between selected parameters $p_i \in P$ from a set of parameters and one of the target states $s_t$. The mathematical functions $f_t$ may be statistical methods such as average values, minimum and maximum values, look-up tables, models of expected values, linear regression methods or Gaussian processes, Fast Fourier transforms, integral and differential calculations, Markov methods, probability methods such as Monte Carlo methods, Temporal Difference Learning, but also extended Kalman filters, radial basis functions, data fields, convergent neural networks, deep neural networks, artificial neural networks and/or feedback neural networks. On the basis of the actions $a_i$ and the rewards $r_i$, the RL agent 200 and/or the action module 300 and/or the environment module 400 and/or the state module 500 and/or the bypass module 600 selects one or more of these calculation functions $f_i$ for a state $s_i$.

Then a second cycle for the construction or design of the component part(s) of the component begins. Here, the RL agent 200 may select another action $a_{i+1}$ and/or another calculation function $f_{i+1}$ and/or another parameter $p_{i+1}$ in accordance with the defined strategy or policy. The result is in turn fed to the state module 500 and the result of the comparison is assessed in the reward module 600. The RL agent 200 repeats the construction process or design process for all of the intended actions $a_i, a_{i+1}, \ldots, a_{i+n}$, calculation functions $f_i, f_{i+1}, \ldots f_{i+n}$ and parameters $p_i, p_{i+1}, \ldots, p_{i+n}$ for as long as it takes until the greatest possible match between a calculated state $s_i, s_{i+1}, \ldots s_{i+n}$ and a target state $s_t$ is achieved. Preferably, the end state of the construction process is achieved when the deviation $\Delta$ lies in the range of +/−5%. The RL agent 200 consequently optimizes its behavior and thereby the strategy or policy on the basis of which an action $a_i$ is selected until the policy converges. The RL agent 200 consequently learns which action(s) $a_i, a_{i+1}, \ldots, a_{i+n}$ are the best for which state $s_i, s_{i+1}, s_{i+n}$. If it goes to the states $s_i, s_{i+1}, \ldots s_{i+n}$ very often and each time tries out a different chain of actions $a_i, a_{i+1}, \ldots, a_{i+n}$ with selected actions $a_i, a_{i+1}, \ldots a_{i+n}$, which may be both very different and very similar, it gathers experience in relation to the policy, and consequently the calibration methodology. When it has gone to the states $s_i, s_{i+1}, \ldots, s_{i+n}$ often enough, and has tried out enough actions $a_i, a_{i+1}, \ldots, a_{i+n}$, the policy can converge to the optimal policy. This means that the optimal action(s) $a_i, a_{i+1}, \ldots, a_{i+n}$ for a determined state are returned in order to arrive at the target state $s_t$.

Figure 2:
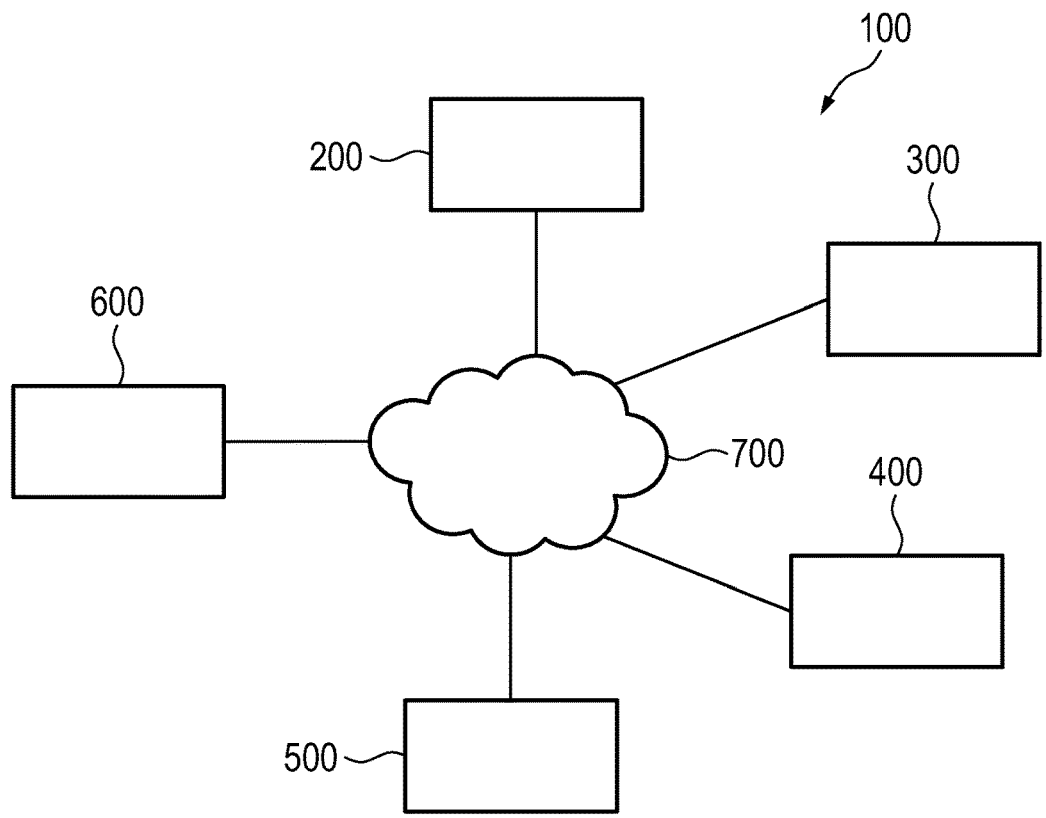
FIG. 2 shows a block diagram for explaining a second exemplary embodiment of the system according to aspects of the invention.

As represented in FIG. 2, it may be provided in particular that the results of the calculation in the form of states, actions, rewards and strategies are stored in a cloud-computing environment 700 and are respectively available via the Internet. The RL agent 200, the action module 300, the environment module 400, the state module 500 and the reward module 600 have in this respect the required technical interfaces and protocols for access to the cloud-computing environment 700. As a result, the calculating efficiency can be increased, since the access possibilities and the access speeds to already calculated states, actions, rewards and strategies is simplified.

Figure 3:
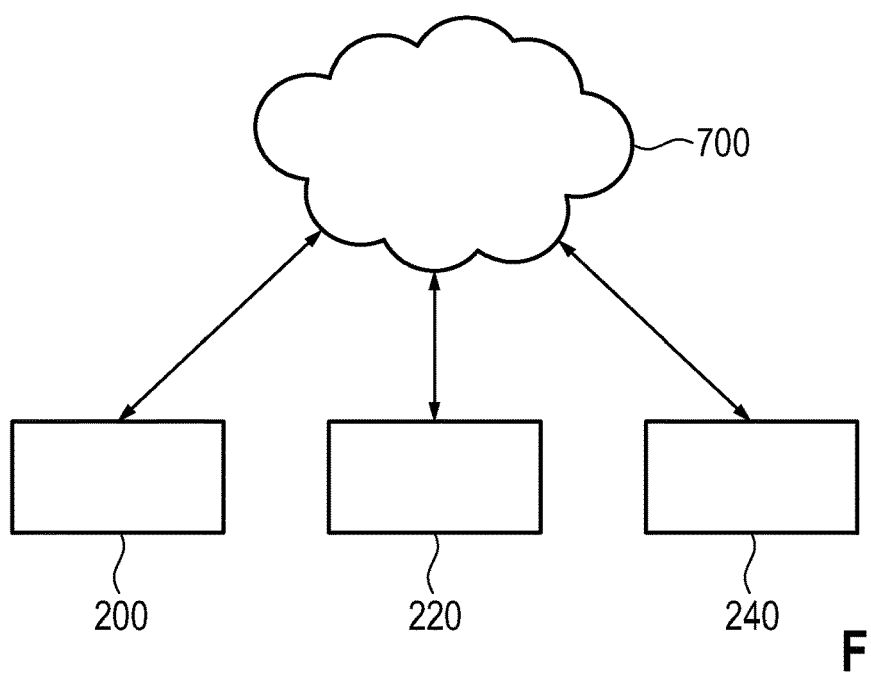
FIG. 3 shows a block diagram for explaining a further detail of the system according to aspects of the invention from FIG. 2.

It may also be provided that the entire software application (computer program product) according to aspects of the invention is stored in the cloud-computing environment 700. As a result, the know-how of the calculation algorithms can be better protected and saved, since these algorithms do not have to be passed on to the environment outside the cloud-computing environment 700. As represented in FIG. 3, in addition a number of RL agents 200, 220, 240, which interact with one another via the cloud-computing environment 700 and respectively store their results in the cloud-computing environment 700, may be coupled. As a result, the quality of the construction or design draft for one or more of the mechanical component parts of the component can be increased, since one RL agent 200 can learn from the experience of the other RL agents 220, 240. Overall, the convergence behavior of the system 100 can in this way be increased.

The reward function R is usually represented as a linear combination of various attributes or features $A_i$ and weights $w_i$, for example as the formula 800:

$$R = w_1 * A_1 + w_2 * A_2 + \ldots + w_n * A_n \qquad (800)$$

For the purposes of this invention, the attributes $A_i$ are in particular the deviation $\Delta$ between a target state $s_t$ and a calculated state $s_i$. The attributes $A_i$ may however also represent other categories. Moreover, other formulas for the reward function R are also possible.

In order to develop an optimal reward function R, the individual weights $w_i$ are adapted, in particular by an expert such as an engineer, so that the reward $r_i$ is maximized. Since this is not an autonomous process of reinforcement learning, such a procedure may be referred to as inverse reinforcement learning.

In addition, optimization algorithms such as yield optimization or entropy optimization and algorithms from statistics such as classification and regression algorithms or Gaussian processes and algorithms from imitative learning can be used for optimizing the reward function R.

According to the method and the system of the present invention, reinforcement learning is used in order to construct and/or design at least one mechanical component part of a component in an autonomous manner. For this purpose, the calculating method includes various parameters $p_i$ such as the dimension, the shaping and/or the material. Since the RL agent 200 independently selects actions $a_i$ for the parameters $p_i$, it is possible in particular to record nonlinear relationships between these parameters $p_i$ that are scarcely taken into account in conventional methods of structural design. This is an autonomous method of structural design, since the RL agent 200 selects the actions $a_i$ itself and respectively receives a reward $r_i$ for them. As a result, optimally constructed and designed mechanical component parts for selected purposes can be provided in a short time and with reduced costs. In particular, constraints that go beyond shaping, such as the cost structure or the environmental balance, can also be taken into account for the component part that is to be constructed. A constraint may for example demand the use of a certain percentage of recycled material in order to comply with environmental regulations.

Figure 4:
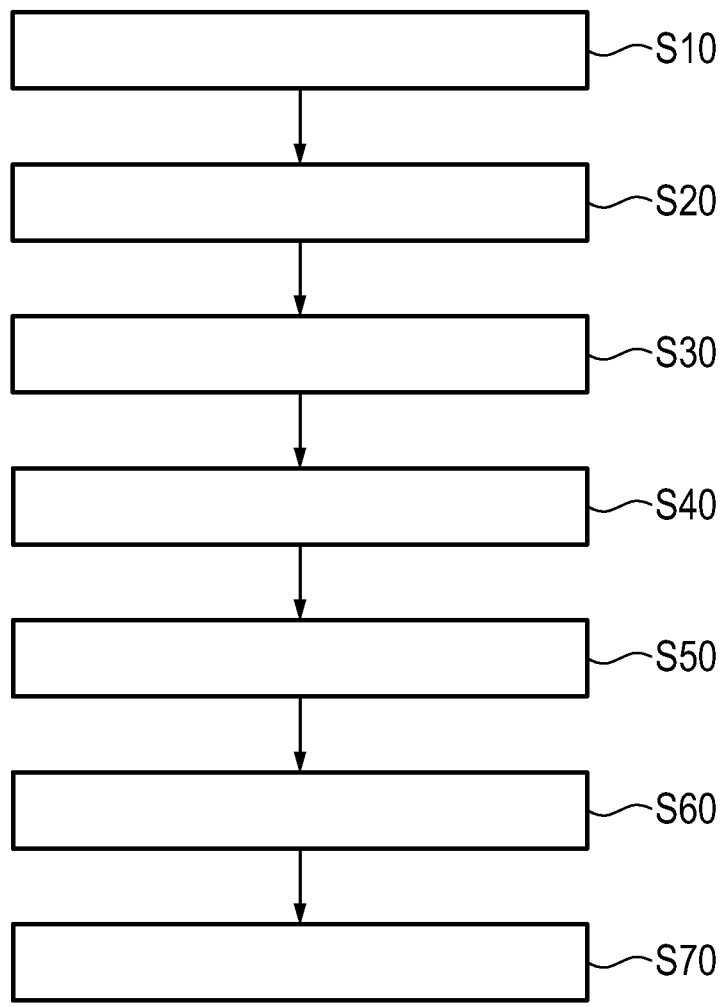
FIG. 4 shows a flow diagram for explaining the individual method steps of a method according to aspects of the invention.

In FIG. 4, the method steps for the autonomous construction and design of at least one mechanical component part for a component are represented.

In a step S10, a state $s_i$ of the component part is transmitted from a state module 500 to a reinforcement learning agent 200, wherein a state $s_i$ is defined by data and measured values of at least one property $e_i$ of the component part and is determined by the state module 500.

In a step S20, the RL agent 200 selects at least one calculation function $f_i$ and/or an action $a_i$ on the basis of a policy for a state $s_i$ for the modification of at least one parameter $p_i$ of the at least one property $e_i$ for the state $s_i$.

In a step S30, an action agent 300 calculates a modeled value for the property $e_i$ by means of the modified parameter $p_i$.

In a step S40, an environment module 400 calculates a new state $s_{i+1}$ on the basis of the modeled value for the property $e_i$.

In a step S50, a state module 500 compares the new state $s_{i+1}$ with a target state $s_t$ and assigns it a deviation $\Delta$.

In a step S60, a reward module 600 ascertains a reward $r_i$ for the result of the comparison.

In a step S70, the policy of the RL agent 200 is adapted on the basis of the reward $r_i$, wherein, when there is a convergence of the policy, the optimal action for the calculated state $s_j$ is returned and, when there is a non-convergence of the policy, a further calculation function $f_j$ and/or a further action $a_{j+1}$ for a state $s_{j+1}$ with a modification of at least one parameter $p_i$ of the at least one property $e_i$ is selected by the RL agent 200 for as long as it takes until the target state $s_t$ is achieved.

FIG. 5 schematically represents a computer program product 900, which comprises an executable program code 950 which is configured to carry out the method according to the first aspect of the present invention when it is executed.

Consequently, with the method according to the present invention, reliably optimized states $s_i$ can be found by the selection of suitable actions $a_i$ in order to construct or design one or more component parts of a component in a reliable and autonomous manner. The use of a reinforcement learning agent 200 with a reinforcement learning algorithm makes it possible to carry out construction or design processes in an autonomous and self-optimizing manner.

REFERENCE SIGNS

100 Construction system
200 Reinforcement learning agent
220 Second RL agent
240 Third RL agent
300 Action module
400 Environment module
500 State module
600 Reward module
700 Cloud-computing environment
800 Formula
900 Computer program product
950 Program code

What is claimed is:

1. A method for autonomous construction and/or design of at least one component part, said method comprising:
   determining (S10) a state ($s_i$) of the component part by a state module, wherein a state ($s_i$) is defined by parameters ($p_i$) including data and/or measured values of at least one property ($e_i$) of the component part;
   transmitting the state ($s_i$) to a reinforcement learning agent, which uses a reinforcement learning algorithm;
   selecting (S20) a calculation function ($f_i$) and/or an action ($a_i$) on a basis of a policy for a state ($s_i$) for a modification of at least one parameter ($p_i$) of said parameters using the reinforcement learning agent;
   calculating (S30) a modeled value for the property ($e_i$) using the modified parameter ($p_i$);
   calculating (S40) a new state ($s_{i+1}$) using an environment module on a basis of the modeled value for the property ($e_i$);
   comparing (S50) the new state ($s_{i+1}$) with a target state ($s_t$) and assigning a deviation ($\Delta$) for a result of the comparison in the state module;
   ascertaining (S60) a reward ($r_i$) by a reward module for the result of the comparison; and
   adapting (S70) the policy of the reinforcement learning agent on the basis of the reward ($r_i$), wherein
      when there is a convergence of the policy, an optimal action ($a_j$) for the calculated state ($s_j$) is returned and, when there is a non-convergence of the calculated policy, a further calculation function ($f_j$) and/or a further action ($a_{j+1}$) for a state ($s_{j+1}$) with a modification of at least one parameter ($p_j$) is selected by the reinforcement learning agent as long as it takes until the target state ($s_t$) is achieved.

2. The method as claimed in claim 1, further comprising providing a positive action (A(+)), which increases a value for a parameter ($p_i$), a neutral action (A(0)), in the case of which the value of the parameter ($p_i$) stays the same, and a negative action (A(−)), in the case of which the value of the parameter ($p_i$) is reduced.

3. The method as claimed in claim 1, wherein the reinforcement learning algorithm is configured as a Markov decision process or as Temporal Difference Learning (TD-learning) or as Q-learning or as SARSA (state action reward state action) or as Monte-Carlo simulation or as an Actor-Critic method.

4. The method as claimed in claim 1, wherein at least one parameter ($p_i$) of the parameters represents a dimension or a material or a shaping or a measured value.

5. The method as claimed in claim 1, wherein at least one property ($e_i$) represents a safety factor or a thermal resistance or an electrical resistance or a conductivity or a strength or a rupture behavior or a color or a density or a plastic deformation or a stress resistance or a compressive resistance or a flexural resistance or material properties or surface properties or a heat treatment.

6. The method as claimed in claim 1, wherein a policy represents an assignment of states ($s_i$) to actions ($a_i$).

7. The method as claimed in claim 6, wherein a policy comprises that, when there is a positive reward ($r_j$) for the calculated state ($s_j$) a selection probability of the previous action ($a_j$) for the calculated state ($s_j$) is increased, when there is a negative reward ($r_j$) for the calculated state ($s_j$) the selection probability of the previous action ($a_j$) for the calculated state ($s_j$) is reduced, and, when there is a convergence of the policy, the optimal action ($a_j$) for the calculated state ($s_j$) is returned.

8. The method as claimed in claim 1, wherein the results of the calculation are stored in the form of states ($s_i$), actions ($a_i$), rewards ($r_i$) and strategies in a cloud-computing environment and are available via the Internet.

9. The method as claimed in claim 8, wherein an RL agent, the action module, the environment module, the state module and the reward module have one or more technical interfaces and protocols for access to the cloud-computing environment.

10. The method as claimed in claim 8, wherein a number of RL agents are coupled and interact with one another via the cloud-computing environment.

11. A computer program product, comprising an executable program code, which is configured to carry out the method as claimed in claim 1 when it is executed.

12. A system for autonomous construction and/or design of at least one component part, said system comprising an RL agent with a reinforcement learning algorithm, an action module, an environment module, a state module and a reward module,
- wherein the state module is configured to (i) determine a state ($s_i$) of the component part, wherein the state ($s_i$) is defined by parameters ($p_i$) including data and/or measured values of at least one property ($e_i$) of the component part, and (ii) transmit the state ($s_i$) to a reinforcement learning agent;
- wherein the reinforcement learning agent is configured to select a calculation function ($f_i$) and/or an action ($a_i$) on a basis of a policy for a state ($s_i$) for modification of at least one parameter ($p_i$) of the at least one property ($e_i$);
- wherein the action module is configured to calculate a modeled value for the property ($e_i$) using the modified parameter ($p_i$);
- wherein the environment module is configured to calculate a new state ($s_{i+1}$) on a basis of the modeled value for the property ($e_i$);
- wherein the state module is configured to compare the new state ($s_{i+1}$) with a target state ($s_t$) and to assign a deviation ($\Delta$) to the result of the comparison;
- wherein the reward module is configured to ascertain a reward ($r_i$) for the result of the comparison and to pass on the reward ($r_i$) for the result of the comparison to the reinforcement learning agent,
- wherein the reinforcement learning agent is configured to adapt the policy on the basis of this reward ($r_i$), wherein, when there is a convergence of the policy, an optimal action ($a_j$) for the calculated state ($s_j$) is returned and, when there is a non-convergence of the policy, a further calculation function ($f_j$) and/or a further action ($a_j$) for a state ($s_{j+1}$) with a modification of at least one parameter ($p_j$) of the at least one property ($e_j$) is selected by the RL agent for as long as it takes until the target state ($s_t$) is achieved.

13. The system as claimed in claim 12, wherein the system is configured to provide a positive action ($A(+)$), which increases the value for a parameter ($p_i$), a neutral action ($A(0)$), in the case of which the value of the parameter ($p_i$) stays the same, and/or a negative action ($A(-)$), in the case of which the value of the parameter ($p_i$) is reduced.

14. The system as claimed in claim 12, wherein the reinforcement learning algorithm is a Markov decision process or a Temporal Difference Learning (TD-learning) process or a Q-learning process or SARSA or a Monte-Carlo simulation.

15. The system as claimed in claim 12, wherein at least one parameter ($p_i$) of the parameters represents a dimension, a material or a shaping and the property ($e_i$) represents a safety factor or a thermal resistance or an electrical resistance or a conductivity or a strength or a rupture behavior or a color or a density or a plastic deformation or a stress resistance or a compressive resistance or a flexural resistance or material properties or surface properties or a heat treatment.

* * * * *